United States Patent [19]

Anthony

[11] 4,377,423

[45] Mar. 22, 1983

[54] LIQUID METAL INCLUSION MIGRATION BY MEANS OF AN ELECTRICAL POTENTIAL GRADIENT

[75] Inventor: Thomas R. Anthony, Schenectady, N.Y.

[73] Assignee: General Electric Company, Schenectady, N.Y.

[21] Appl. No.: 372,857

[22] Filed: Apr. 28, 1982

Related U.S. Application Data

[63] Continuation-in-part of Ser. No. 221,142, Dec. 29, 1980, abandoned.

[51] Int. Cl.³ .................. H01L 21/326; H01L 21/225
[52] U.S. Cl. .................................... 148/171; 148/1.5; 148/172; 148/183; 75/65 ZM; 156/602; 156/616 R; 29/584; 29/585; 29/590; 204/130; 204/140
[58] Field of Search ................ 148/171, 172, 183, 1.5; 75/65 ZM; 156/602, 616 R; 29/584, 585, 590; 204/130, 140

[56] References Cited

U.S. PATENT DOCUMENTS

| | | | |
|---|---|---|---|
| 2,813,048 | 11/1957 | Pfann | 75/65 ZM |
| 3,188,244 | 6/1965 | Hutchins et al. | 148/1.5 |
| 3,378,409 | 4/1968 | Hurle et al. | 148/171 X |
| 4,012,242 | 3/1977 | Mataré | 148/171 X |
| 4,049,505 | 9/1977 | Chatterji | 148/183 X |

*Primary Examiner*—G. Ozaki
*Attorney, Agent, or Firm*—Stephen S. Strunck; James C. Davis, Jr.; James Magee, Jr.

[57] ABSTRACT

Liquid metal inclusions are migrated in a host body of semiconductor material by means of an electrical potential gradient to produce regions of recrystallized single crystal semiconductor material in the host body. The resistivities of the regions and the semiconductor material of the host body will be different and if the conductivity types of the regions and the semiconductor material of the host body are also different, P-N junctions will be formed between the regions and the host body.

26 Claims, 15 Drawing Figures

LIQUID METAL INCLUSION MIGRATION BY MEANS OF AN ELECTRICAL POTENTIAL GRADIENT

CROSS-REFERENCE

This application is a continuation-in-part of copending U.S. patent application Ser. No. 221,142, filed Dec. 29, 1980 now abandoned; the entirety of which is herein incorporated by reference.

In U.S. patent application Ser. No. 272,801 filed June 11, 1981, in the name of T. R. Anthony and assigned to the same assignee as the instant application, methods are disclosed for the fabrication of anode and cathode connections useful generally in the practice of migration of liquid metal inclusions by means of an electrical potential gradient and particularly useful in circumventing the adverse effects of several types of rectifying junctions. The subject matter of the foregoing application is incorporated herein by reference.

FIELD OF THE INVENTION

This invention relates generally to a method for the migration of liquid metal inclusions in semiconductor materials by means of an electrical potential gradient to produce regions of recrystallized single crystal semiconductor material therein and more particularly to the formation of P-N junctions by the method.

BACKGROUND OF THE INVENTION

The process of migrating a liquid metal inclusion through a solid using a thermal gradient, known as Temperature Gradient Zone Melting (TGZM), was invented by Pfann and is described, for example, in his U.S. Pat. No. 2,813,048 issued Nov. 12, 1957. In Pfann's process either sheets or wires of a suitable metallic liquid were moved through a semiconductor material by a thermal gradient. Doped liquid-epitaxial material was left behind as the liquid wire migration progressed. Subsequently, several investigators found that the planar liquid zone was unstable and that droplets of liquid broke away from the zone and were trapped in the recrystallized material. For that reason, material produced by Pfann's TGZM process was not suitable for the manufacture of semiconductor devices.

The TGZM process has, however, recently been developed by Anthony and Cline into a viable commercial process for producing P-N junction structures in semiconductors such as, for example, the isolation grids described in their U.S. Pat. Nos. 3,979,230 and 3,998,662; the entirety of which are herein incorporated by reference. For detailed information on the recently developed TGZM process, apparatus, and P-N junction devices produced thereby, in general, reference may be made, for example, to U.S. Pat. Nos. 4,075,038; 4,091,257; and 4,224,594, respectively; the entirety of which are also herein incorporated by reference.

Briefly, in the commercial version of the TGZM process, semiconductor wafers are placed between an array of air-cooled high-temperature quartz lamps and a water-cooled heat sink. Infrared radiation from the lamps is absorbed and converted into heat by the wafer surface facing the lamps. This heat then passes through the wafer and is re-radiated to the heat sink by the opposing wafer surface. The thermal gradient that drives the TGZM process is generated by the heat flow through the wafer. Typical apparatus for the commercial practice of the TGZM process is described in U.S. Pat. No. 4,221,956; the entirety of which is incorporated herein by reference.

SUMMARY OF THE INVENTION

In accordance with the teachings of this invention, there is provided a method (electromigration) for the migration of one or more molten zones of metal-rich semiconductor material, i.e., liquid metal inclusions, in a solid host body of single crystal semiconductor material to form one or more regions of recrystallized single crystal semiconductor material of the body therein. The method is especially suited for the production of devices requiring a sharp boundary, i.e., junction, between the material of the host body and the adjacent region of recrystallized semiconductor material; particularly if the molten zone is only migrated partially through the body and the sharp boundary is required at the host-material/recrystallized-material interface in the direction of migration.

The method derives its utility, stability, and controllability from the use of an electrical potential gradient as the driving force for the migration of liquid metal inclusions in contrast to the thermal gradient driving force of the Temperature Gradient Zone Melting process (TGZM). Since the metallurgy of liquid metal inclusion migration is substantially the same whether the driving force is an electrical potential gradient or a thermal gradient, all configurations of P-N junctions in semiconductor crystals producible by the TGZM process are expected to be producible by the electromigration process of this invention.

Briefly, the process steps of the invention are first to determine the direction the liquid metal inclusions are to be migrated along paths in the host body of single crystal semiconductor material between anode and cathode connections.

Second, one or more solid metallic bodies are deposited in contact with the host body. The material of each of the solid metallic bodies is selected such that the material of each of the solid metallic bodies (1) is soluble in the semiconductor material of the host body, (2) forms a solution with the semiconductor material of the host body which has a melting temperature lower than the melting temperature of the semiconductor material of the host body, and (3) has a work function, $\phi_i$, such that the quantity $(\phi_i - \phi_h)$, where $\phi_h$ is the work function of the semiconductor material of the host body, has the same algebraic sign as the connection toward which the inclusions are to be migrated. The material of the solid metallic bodies may be a metallic element or a metallic alloy as required to produce desired physical characteristics, such as resistivity and conductivity type, in the region or regions of recrystallized single crystal semiconductor material to be formed in the host body. The material of the solid metallic body may also be a metallic element or alloy having therein a nonmetallic (metalloid) element such as boron or phosphorus.

As used herein, the concept of depositing metal in contact with the host body encompasses the situation wherein the metal is located entirely within the host body, i.e., not in contact with any of its surfaces, as well as the situation wherein the metal is initially located on a surface of the body. The metallic bodies may have a droplet-like configuration, a linear, or a planar mesh-like configuration. If the metallic bodies have a linear configuration, the longitudinal axis of the linear configuration is substantially aligned with a crystallographic wire direction for the host body and the metal to be migrated. If the metallic bodies have a mesh-like configuration, the longitudinal axes of the linear elements of the mesh are substantially aligned with crystallographic wire directions for the host body and the metal to be migrated. If the metallic body or bodies are deposited on an exposed surface, the deposition is preferably performed by means, such as electron beam evaporation in a vacuum, which produce a substantially oxygen-free mass of metal.

Third, the anode and cathode connections are made to the host body. The cross-referenced patent application discloses, inter alia, methods for the manufacture of connections generally useful in the practice of electromigration other than the simple pressure-contact electrodes described herein.

Fourth, the host body and the deposited solid metallic body or bodies are heated to an elevated temperature substantially constant and uniform throughout the host body sufficient to form one or more melts, i.e., liquid metal inclusions, of metal-rich semiconductor material. Fifth, an electrical potential gradient is applied through or across the host body between the anode and cathode connections. The potential gradient is generally established substantially parallel to the path or paths along which the one or more liquid metal inclusions are to be migrated.

Lastly, the one or more liquid metal inclusions of metal-rich semiconductor material are simultaneously moved, i.e., electromigrated, as a molten zone along the path or paths through or within the solid body of semiconductor material by the force of the applied electrical potential gradient. The movement of each molten zone through the semiconductor material of the solid host body produces a region of recrystallized single crystal semiconductor material which comprises the material of the liquid metal inclusion in solid solution up to the solid solubility limit of the material of the liquid metal inclusion in the semiconductor material of the host body. Each region of recrystallized single crystal semiconductor material will have at least a resistivity different from that of the semiconductor material of the host body determined primarily by the nature of the material of the liquid metal inclusion and the elevated temperature at which the electromigration was conducted. By appropriately selecting the material of the liquid metal inclusion, the region of recrystallized semiconductor material of the solid host body may also have a conductivity type different from the conductivity type of the semiconductor material of the host body.

The process may be practiced, for example, to move one or more molten zones entirely through the body from a first surface to a second surface. Also, for example, the molten zone or zones may be stopped between the surfaces and a reverse gradient imposed to move the molten zone or zones, preferably along the same initial path or paths, to the first surface leaving behind a sharp boundary between processed and unprocessed semiconductor material of the body particularly in the direction of migration.

It has been further discovered that when the host body of single crystal semiconductor material is a thin film, the electromigration method of the invention produces regions of recrystallized semiconductor at rates 100 to 1000 times greater than those obtained when the method is practiced in bulk host bodies of semiconductor materials.

BRIEF DESCRIPTION OF THE DRAWINGS

The invention is more clearly understood from the following description taken in conjunction with the accompanying drawings wherein.

DETAILED DESCRIPTION OF THE INVENTION

Figure 1:
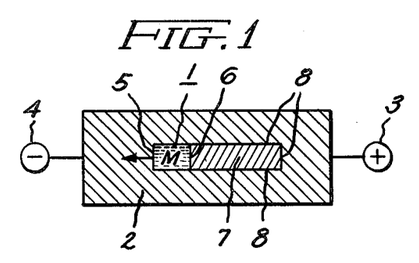
FIG. 1 is a schematic representation in cross-section of a liquid metal inclusion electromigrating within a body of semiconductor material in response to an applied electrical potential gradient.

With reference to FIG. 1, it has been discovered that a liquid metal inclusion 1 in a semiconductor single crystal 2, through which a direct (DC) electric current is passing, will migrate along the lines of current flow either towards anode 3 or cathode 4. The motion of liquid inclusion 1, as indicated by the arrow in FIG. 1 and subsequent Figures, is caused by a flux of dissolved semiconductor atoms across inclusion 1, induced by the electric current passing through liquid inclusion 1. To feed this flux of semiconductor atoms, atoms of semiconductor 2 dissolve into inclusion 1 at forward face 5 while dissolved semiconductor atoms are deposited at rear face 6. For the purpose of this invention, the flow of DC current is from cathode 4 to anode 3, thus the direction, i.e., polarity, of the electrical potential gradient through or across semiconductor body 2 will also be from cathode 4 to anode 3. Inclusion 1, will preferably be situated to lie along the direction, or path, of the electrical potential gradient. Inclusion 1 will electromigrate in response to the electrical potential gradient substantially along that path either toward cathode 4 or anode 3.

In the deposited recrystallized single crystal semiconductor trail 7 behind electromigrating inclusion 1, trace amounts of the material, i.e., metal, or metals, or metalloids or combinations thereof, comprising inclusion 1 are left behind up to the solid solubility limit of the material of inclusion 1 in semiconductor 2. Due to the presence of the trace amounts of the material of inclusion 1 in trail 7, the resistivity of trail 7 will be different from the resistivity of the material of host semiconductor 2. If the material making up inclusion 1 is an electrically active dopant (also called an impurity) for semiconductor 2, then deposited semiconductor trail 7 will be doped either N-type or P-type depending on the valence state and concentration of the dopant. By electromigration of a P-type liquid metal inclusion 1 through an N-type semiconductor material 2 or an N-type liquid metal inclusion through a P-type semiconductor material, P-N junctions 8 can be formed in semiconductor crystal 2. Because the electromigration velocities of liquid metal inclusions are orders of magnitude greater than the solid-state diffusion coefficients of the same metals, liquid metal inclusion electromigration provides a means of forming P-N junctions in semiconductor bodies in a matter of minutes instead of days.

Figure 2:
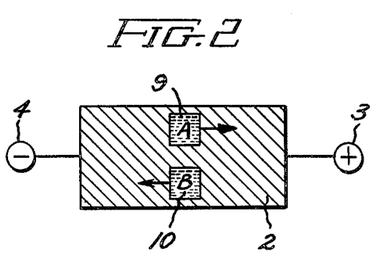
FIG. 2 is a schematic representation in cross-section of two liquid metal inclusions of different composition electromigrating in opposite directions in the same body of semiconductor material in response to the same applied electrical potential gradient.

Not all liquid metal inclusions electromigrate in the same direction in a given semiconductor material in response to a given electrical potential gradient. As discovered in the course of the making of this invention, and illustrated schematically in FIG. 2, liquid metal inclusion 9 of metal A with a work function greater than 4.55 electron volts (eV) will electromigrate toward anode 3 while liquid metal inclusion 10 of metal B with a work function less than 4.55 eV will simultaneously electromigrate toward cathode 4 in silicon. The Table below shows, in part, the electromigration directions of 9 metals in silicon and their work functions. Antimony will not electromigrate in silicon because its work function is nearly identical to the work function of silicon, but antimony will electromigrate in host semiconductor materials having appreciably different work functions, e.g., germanium and gallium arsenide, than silicon.

TABLE

| Element | Electromigration Direction | Work Function (eV) | Activation Energy, Q (kcal/mol) | Pre-Exponential Factor $(V/I)_o$ (cm$^3$/coulomb) |
|---|---|---|---|---|
| Palladium | Anode(+) | 5.12 | 26.1 | $1.5 \times 10^{-2}$ |
| Gold | Anode | 5.10 | 21.3 | $5.6 \times 10^{-4}$ |
| Copper | Anode | 4.65 | 18.3 | $3.2 \times 10^{-5}$ |
| Antimony | No electromigration | 4.55 | — | — |
| Tin | Cathode(−) | 4.42 | 24.5 | $2.4 \times 10^{-4}$ |
| Aluminum | Cathode | 4.28 | 20.8 | $8.2 \times 10^{-4}$ |
| Silver | Cathode | 4.26 | 17.3 | $9.5 \times 10^{-5}$ |
| Gallium | Cathode | 4.20 | 14.5 | $2.1 \times 10^{-5}$ |
| Indium | Cathode | 4.12 | 24.7 | $5.0 \times 10^{-4}$ |

Figure 3:
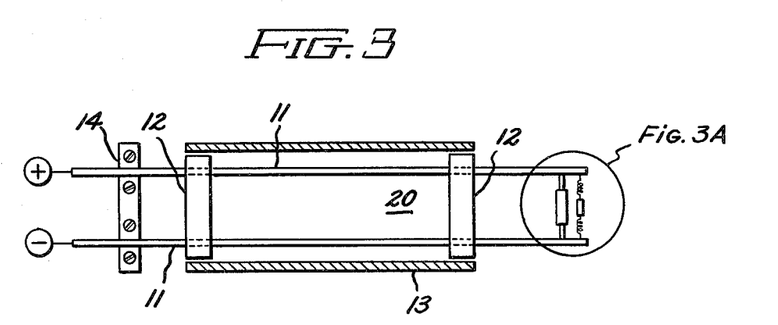
FIG. 3 is a schematic drawing in cross-section of the apparatus used for electromigration.
Figure 3A:
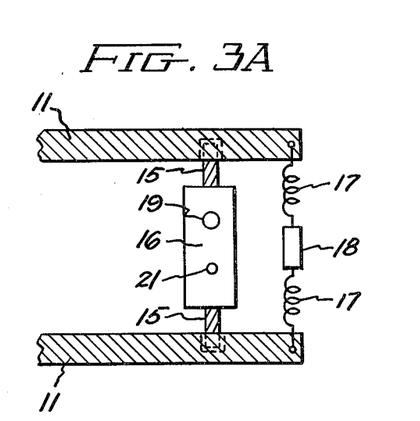
FIG. 3A shows in schematic cross-section an enlargement of the region denoted by a circle in FIG. 3.

The Table was compiled from data obtained during the course of the making of this invention. To obtain the data, electromigration apparatus 20 shown schematically in FIG. 3 and a standard diffusion furnace (not shown) were employed. Apparatus 20 comprised two opposed ¼ inch diameter molybdenum rods 11 supported at two locations by 2 inch diameter cylindrical ceramic inserts 12 which were 3 inches in length. For structural rigidity, molybdenum rods 11 in ceramic supports 12 were inserted into 2 inch inside diameter stainless steel tube 13 measuring 20 inches in length and having a ⅛ inch thick wall. For additional support, molybdenum rods 11 were secured beyond the area of the stainless steel tube 13 by clamp 14 made from an inert electrically non-conductive rigid material. With reference now to FIG. 3A, replaceable molybdenum rods 15 measuring ⅛ inch in diameter were used as electrode contacts to silicon specimen 16. Tungsten springs 17 provided contact pressure between molybdenum electrodes 15 and silicon specimen 16 throughout the high-temperature electromigration experiments conducted in the course of the making of this invention. Ceramic piece 18 provided electrical insulation between springs 17.

Specimens 16 measuring 4 cm × 1 cm × 1 cm were cut from an N-type 10 ohm-cm silicon ingot. The long dimension of rectangular specimens 16 was parallel to the <111> direction. The top face and side faces were perpendicular, respectively, to the $<\overline{1}10>$ and $<\overline{1}\overline{1}2>$ directions. From the top (110) face of specimen 16, two holes were ultrasonically drilled halfway through specimen 16. The holes, shown in FIG. 3A, were each symmetrically located 1.5 cm from the opposing ends of sample 16. Larger hole 19, 2 mm in diameter, was used as a thermocouple hole, while smaller hole 21, 0.75 mm in diameter, was used as an inclusion cavity. The top and side surfaces of specimen 16 were polished to a 1μ finish and fiduciary lines were drawn on the top and side surfaces with a diamond scribe to enable the progress of the electromigration to be observed using infrared transmission microscopy. A 0.70 mm diameter wire of the metal to be migrated was inserted into smaller hole 21. Specimen 16 was then placed in an annealing furnace (not shown) with flowing H₂ at 1100° C. for 3 hours to form the metal-rich semiconductor solution that would subsequently be electromigrated as a liquid metal inclusion. Specimen 16 was then cooled and removed from the annealing furnace.

In the study of electromigration parameters, the end of apparatus 20 holding specimen 16 and about ½ the length of stainless steel tube 13 were inserted into the diffusion furnace (not shown) and heated to the electromigration temperature. A flow of 95% N₂+5% H₂ was used to prevent oxidation of apparatus 20. After temperature equilibration, a constant DC current of from 3 to 30 amperes was passed through silicon specimen 16 for times ranging from 20 to 240 hours. Fixed temperatures from 400° C. to 1100° C. were used and were continuously monitored with a chromel-alumel thermocouple inserted in thermocouple hole 19. Following electromigration, apparatus 20 was withdrawn from the diffusion furnace and allowed to cool. Specimen 16 was removed and infrared transmission micrographs were taken to determine the movement of the metal-rich liquid inclusion through silicon specimen 16. Measurements of the inclusion displacement were made on the micrographs with reference to the diamond-scribed fiduciary lines on the surface of the specimen.

The currents were supplied by a Hewlett-Packard 6269B constant current DC power supply (not shown). A constant current supply was necessary because of the sharp change of resistivity of silicon specimen 16 with temperature. Depending on the electromigration temperature, a voltage drop of from approximately 1 to 6 volts was required by the power supply to drive the 3 to 30 ampere DC currents, respectively, used in the course of the making of the invention. Most of the voltage drop occurred at various electrical contact points in the circuit rather than in silicon specimen 16 itself.

Specimen heating to the preselected electromigration temperature can be effected by Joule heating, by an external heat source such as a furnace, or a combination of the two. Joule heating is the simplest and ultimately provides the fastest electromigration velocities, but is the least controllable since the applied potential provides both joule heating and the electromigration potential. External heating with use of the potential gradient to control the motion of the zone is the most controllable and is ideally suited for the manufacture of in-and-out junctions having little depth below the surface from which they were migrated.

Figure 4:
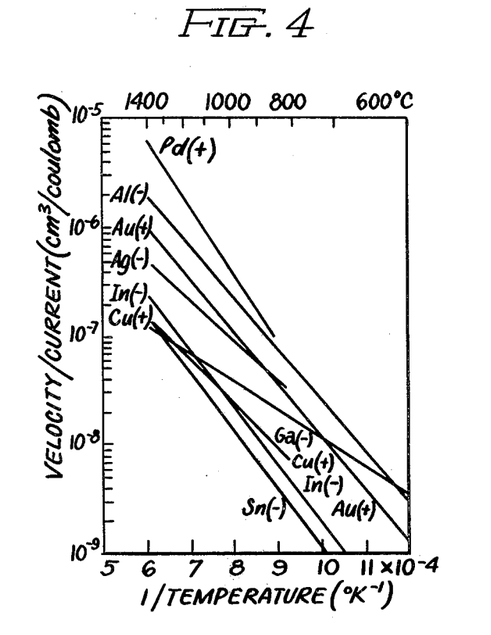
FIG. 4 is a semi-logarithmic graph of the electromigration directions and the electromigration velocity divided by the applied current parameter for eight types of metal-rich inclusions electromigrating in silicon versus electromigration temperature.

In general, the electromigration velocities, V, of the metal-rich inclusions were discovered to be a linear function of the current density, I, i.e., V=αI where α is a proportionality factor, whether the inclusions migrated towards the anode or the cathode, over a current density range of from 3 to 30 amps/cm². It was thus discovered that electromigration proceeds at speeds similar to those found in thermomigration at relatively low current levels of the order of 5 amps/cm² when both processes are carried out at the same nominal temperature. FIG. 4 shows the electromigration directions and the electromigration velocity divided by current density for the eight types of metal-rich liquid inclusions electromigrated in silicon as a function of the electromigration temperature.

Figure 5:
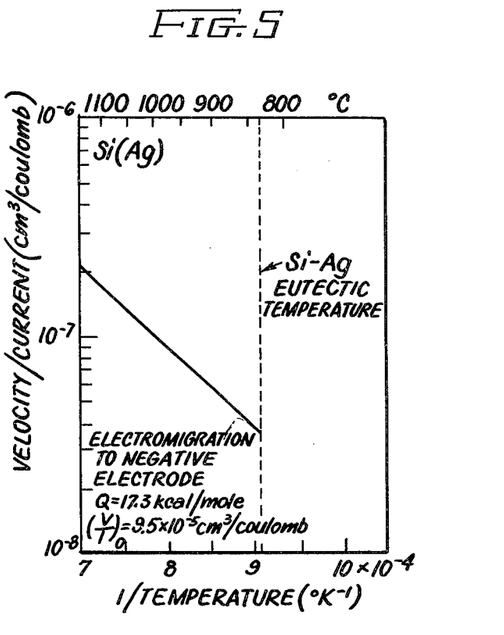
FIG. 5 is a semi-logarithmic graph of the electromigration velocity divided by the current parameter as a function of electromigration temperature for silver-rich liquid metal inclusions electromigrating in silicon.

The metal-rich inclusions theoretically are able to electromigrate throughout the temperature range bounded by the metal-semiconductor eutectic temperature and the melting point of the semiconductor. The inclusion electromigration velocity divided by the current for the liquid metal inclusions follows an Arrhenius function of temperature $$\frac{V}{I} = \left(\frac{V}{I}\right)_o \exp\left(-\frac{Q}{RT}\right) \tag{1}$$

as is typically shown in FIG. 5 for silver-rich inclusions electromigrating in silicon. In equation (1), V is the electromigration velocity in cm/sec, I is the current density in amps/cm², Q is the activation energy in kcal/mole, R is the gas constant, T is the absolute temperature at which electromigration is conducted, and $(V/I)_o$ is the pre-exponential in cm³/coulomb. Activation energies ranged from a low of 14.5 kcal/mole for Ga to a high of 26.1 kcal/mole for Pd. The activation energies and pre-exponential functions for the 8 elements capable of electromigration in silicon are also summarized in the Table.

An analytical study was made into the mechanisms contributing to electromigration using the data of the Table. The complete details of the study have been reported by Anthony in the Journal of Applied Physics, Vol. 51, No. 12 (Dec. 1980), pp. 6348–6355 and 6356–6365; the entirety of which are herein incorporated by reference. In brief summary of the herein incorporated articles, it was found that the major driving force for liquid metal inclusion electromigration was electronatom momentum exchange or the so-called electron wind effect. Further, the direction of electromigration in silicon was discovered to correlate with the work functions of the metals comprising the liquid inclusions i.e., inclusions of a metal with a work function greater than 4.55 eV electromigrated towards the anode while inclusions of a metal with a work function less than 4.55 eV electromigrated towards the cathode. Lastly, the relative order of electromigration velocities of liquid metal inclusions within the anode-directed and cathode-directed groups could be accounted for by the magnitude of the deviation of the work function of the inclusion, $\phi_i$, from the value of the work function at which no electromigration occurred, i.e., the work function of the host material through which the inclusions migrated, $\phi_h$, plus factors which accounted for the solubility of dissolved silicon in the inclusion and mass conservation.

For a liquid metal inclusion migrating in a solid host material, the flux, J, of host atoms passing through the inclusion is given by equation (2)

$$J = V(C_s - C_L) \tag{2}$$

which is the well known law for the Conservation of Mass wherein $C_L$ is the concentration of host atoms in the liquid inclusion per unit volume and $C_s$ in the concentration of host atoms per unit volume and V is the migration velocity.

Combining equation (2) with equation (3)

$$J = Mf(C_L) \tag{3}$$

which is the well known Einstein Equation wherein M is the mobility of the host atoms in the liquid inclusion, f is the driving force on the host atoms in the liquid inclusion with J and $C_L$ as defined above, equation (4) results $$V = Mf\left(\frac{C_L}{C_s - C_L}\right) \quad (4)$$

Since the velocity, V, of the electromigrating inclusion was discovered to be proportional to the current density, I, and to the magnitude of the deviation of the work function of the inclusion, $\phi_i$, from the work function of the host material, $\phi_h$, equation (5) follows $$V = \beta I \Delta\phi \quad (5)$$

where $\Delta\phi$ is equal to $\phi_i - \phi_h$ and $\beta$ is a constant.

Comparison of equations (4) and (5) shows that $$f = \gamma I \Delta\phi \quad (6)$$

where $\gamma$ is a proportionality constant.

Combining equations (6) and (4) yields $$\frac{V}{I} = k\left(\frac{C_L}{C_s - C_L}\right)\Delta\phi \quad (7)$$

where k is a constant derivable from FIG. 4 and equation (7) and in CGS units is $10^{+6}$ cm$^3$/(coulombs-electron volts). From the Table, a negative value of V/I indicates that the inclusion will electromigrate towards the cathode and a positive value indicates that the inclusion will electromigrate towards the anode.

To manufacture a particular semiconductor device, it may be desirable to have a liquid inclusion that electromigrates toward the anode and that dopes the silicon P-type. From the Table, it is seen that all of the pure P-dopant inclusions (Al, Ga, and In) electromigrate toward the cathode. Hence, to obtain an inclusion that will both electromigrate towards the anode and dope the silicon P-type, an alloy inclusion having the proper work function must be formed of, for example, Al and Pd in the right proportions.

In order to obtain the correct inclusion composition for this and other cases, information was sought on the electromigration directions of inclusions composed of more than one metal. A priori, one would expect that droplets made of more than one metal would follow a rule of mixtures so that a composite work function, $\phi_i^*$, of the alloy inclusion would be given by $$\phi_i^* = X_A\phi_A + X_B\phi_B + X_C\phi_C + \ldots \quad (2)$$

where $\phi_A$, $\phi_B$, $\phi_C$, ... etc. are respectively the work functions of the pure elements and $X_A$, $X_B$, $X_C$, ... etc. are the atomic fraction of the elements comprising the alloy inclusion. If the composite work function of the alloy is greater than 4.55 electron volts, the liquid alloy inclusion would be expected to electromigrate towards the anode in silicon. On the other hand, if the composite work function of the alloy is less than 4.55 electron volts, the liquid alloy inclusion would be expected to electromigrate towards the cathode in silicon.

To test the rule of mixtures hypothesis, the electromigration directions of a series of gold-silver alloys was measured. Gold and silver were selected for several reasons. First, both of these noble metals are chemically similar and have almost identical atomic radii. In addition, they form continuous solid and liquid solutions so that extraneous factors such as eutectics, intermetallics, or liquid immiscibility gaps would not complicate the study. Of particular importance was the fact that the inclusions of these two noble elements electromigrate in opposite directions. Also, based on the discoveries of this invention related to the electromigration of elements in silicon, a temperature (884° C.) could be selected where the absolute magnitudes of the oppositely directed velocities of gold and silver inclusions would be equal. Finally, the work functions of Au-Ag alloys of varying compositions were available in the literature so that a comparison of the electromigration direction of a particular alloy composition with its work function would be possible.

Figure 6:
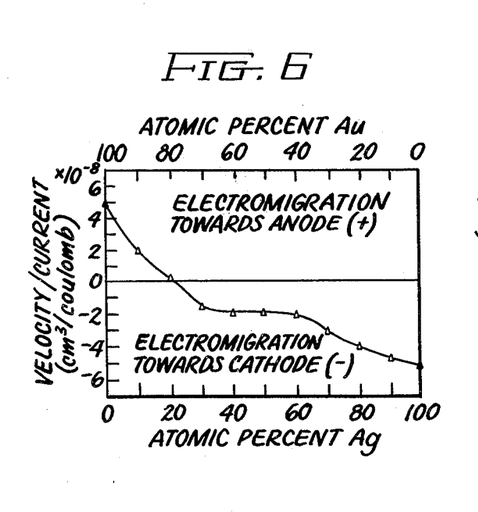
FIG. 6 is a graph of the electromigration velocity divided by current parameter as a function of alloy composition for a series of silver-gold liquid metal alloy inclusions electromigrating in silicon.

Using apparatus 20 and the techniques described above, 11 different Au-Ag alloys, varying in composition from 0 to 100% Ag at 10% composition intervals (i.e., 0, 10, 20% Ag, etc.), in 11 separate sample cavities were electromigrated in a single silicon sample 16 at 884° C. FIG. 6 shows the electromigration velocities of the 11 Au-Ag alloys vs. composition. Alloys having silver in excess of about 21% were found to migrate toward the cathode while alloys having less than about 21% silver were found to electromigrate toward the anode.

As shown by Anthony in the Journal of the Electrochemical Society, Vol. 128, No. 12 (March 1981), pp. 597-600, the entirety of which is incorporated herein by reference, a simple dilute solution theory using the difference in the work function of the metal comprising the inclusion and an empirical null-point work function can be formulated and used to explain the electromigration directions of alloys of gold and silver in silicon.

Figure 7:
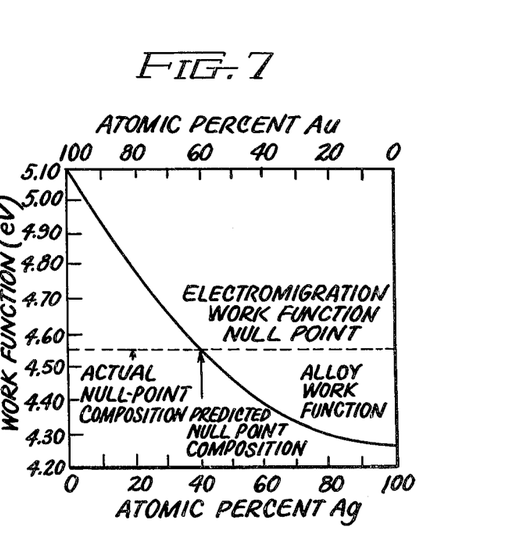
FIG. 7 is a graph of work function versus alloy composition for gold-silver alloys.

In brief summary of that article, FIG. 7 shows the work function of Au-Ag alloys plotted vs composition. Based on the null-point work function for silicon of 4.55 eV, an electromigration null-point composition of 40% Ag-60% Au would be expected. However, since at the temperature of electromigration, the electromigration velocities of pure gold and pure silver inclusions are equal and opposite, a simple linear extrapolation would indicate that the null-point composition would be at 50% Au-50% Ag. In the experiments conducted in the course of this invention, a shift of the null point to a gold-rich composition was found instead.

A shift to a gold-rich composition was qualitatively predicted by the nonlinear work function of Au-Ag alloys which shows a much steeper change on the gold-rich side of the work-function composition diagram than on the silver side. Thus, there was qualitative agreement between the discovered experimental null point and the null point predicted by the work functions of the alloys as far as the shift to the gold-rich side of the diagram. However, quantitatively, the predicted null-point alloy composition of 60% Au-40% Ag does not agree with the discovered null-point composition of 79% Au-21% Ag. This quantitative disagreement is not surprising since the work function of a pure alloy at room temperature, no doubt, does not equal the work function of the same alloy liquid containing dissolved silicon at 884° C. In view of the quantitative disagreement between electromigration direction and work function for the Au-Ag alloys, the substantially perfect correlation of electromigration directions with work functions discovered herein for the pure liquid metal inclusions is all the more surprising.

Due to the discoveries of the invention, it is possible to predict electromigration directions or to tailor the composition of the liquid metal inclusion to cause it to migrate in a desired direction particularly when the direction of the electrical potential gradient is fixed by external factors, e.g., the nature of the host body of semiconductor material.

Figure 8:
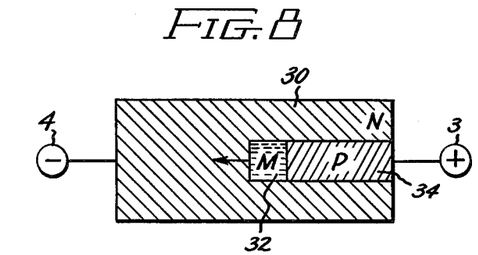
FIG. 8 is a schematic representation in cross-section of a liquid metal inclusion electromigrating in a host body of N-type semiconductor material forming a trail of recrystallized P-type semiconductor material.

With reference to FIG. 8, there is shown a first case of a host body of single crystal semiconductor material 30 having impurity (or dopant) atoms therein of the type which imparts, for example, N-type conductivity to host body 30. Assume liquid metal inclusion 32 is to be electromigrated toward cathode 4 as shown so as to produce a recrystallized single crystal semiconductor trail 34 of P-type. This may be done by selecting a material for inclusion 32 such that when the work function of the semiconductor material of host body 30, $\phi_h$, is subtracted from the work function of the material of inclusion 32, $\phi_i$, the same algebraic sign (+ or −) as the connection towards which inclusion 32 is to be migrated is obtained, i.e., (−) cathode 4 in this case.

From the Table, the above first case condition is met for silicon by the use of aluminum, indium or gallium as the material for inclusion 32. Tin and silver will electromigrate toward cathode 36 and form a recrystallized trail 34 of different resistivity from that of silicon, but will not impart a P or N-type conductivity.

If the conditions of FIG. 8 are kept the same, except that connections 3 and 4 are reversed, i.e., electromigration is to be toward the (+) anode, a second case is presented and the material of liquid metal inclusion 32 must be chosen such that the algebraic sign of $(\phi_i - \phi_h)$ is positive (+). From the Table, this condition is met in silicon by palladium, gold, and copper except that none of these three are N or P-type dopants. To fulfill these new requirements, alloys of palladium, gold or copper must be made with P-type dopants such as aluminum, indium, or gallium; or palladium, gold or copper must be used as a carrier for a non-electromigratable nonmetallic (metalloid) P-type dopant, e.g., boron. Non-electromigratable, nonmetallic N-type dopants include, for example, phosphorus and arsenic.

Figure 9:
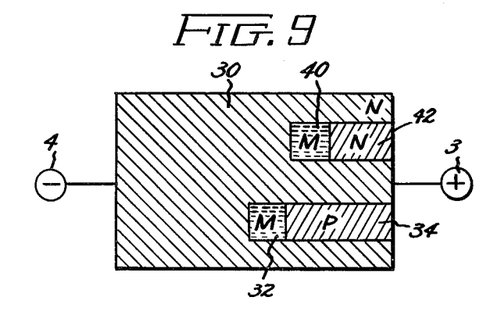
FIG. 9 is a schematic representation in cross-section of two liquid metal inclusions electromigrating in a host body of N-type semiconductor material, one forming a trail of recrystallized P-type semiconductor material and the other forming a trail of recrystallized N-type semiconductor material.

In many cases, the difficulties presented by the second case discussed above in connection with FIG. 8 can be avoided by selection of the polarity of the electrical potential gradient, i.e., reversing the anode and cathode connections. In many cases, however, the polarity cannot be reversed and thus the polarity represents an additional constraint on the process. For example, in FIG. 9 there are shown liquid metal inclusions 32 and 40 electromigrating simultaneously toward cathode 4 through N-type host body of single crystal semiconductor material 30 forming P-type and N-type recrystallized trails 34 and 42, respectively. In this case, the materials of inclusions 32 and 40 must both be selected such that the algebraic sign of $(\phi_i - \phi_h)$ is negative. Reversal of the polarity may make the selection of the materials for inclusions 32 ad 40 easier, but nevertheless the polarity represents a constraint.

Figure 10:
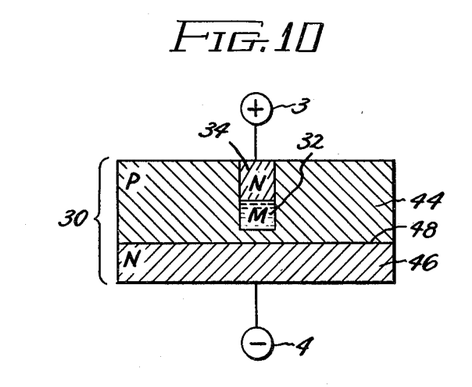
FIG. 10 is a schematic representation in cross-section of a liquid metal inclusion electromigrating in the P-type layer of a layered composite host body of semiconductor material forming an N-type trail in the P-type layer.

In FIG. 10, host body of single crystal semiconductor material 30 is a composite, i.e., P-type layer 44 on top of N-type layer 46. Since junction 48 between layers 44 and 46 is a P-N type junction, the electrical potential gradient can only be established as shown in FIG. 10. Thus, in order to electromigrate liquid metal inclusion 32 through layer 44 to junction 48 leaving a recrystallized trail 34 of the N-type to form thereby a "sinker", the material of inclusion 32 must be selected such that the algebraic sign of $(\phi_i - \phi_h)$ is negative; a situation similar to that of case two discussed above in conjunction with FIG. 8 with respect to the selection of materials for inclusion 32.

Even if the situation of FIG. 10 is changed so that layer 44 is N-type, layer 46 is P-type and trail 34 is to be P-type, then the gradient must be reversed, i.e., electromigration will be towards the (+) anode, and the more difficult situation of case two discussed above in conjunction with FIG. 8 remains. However, by the method of the invention, it is now possible to tailor the composition of the material for the liquid metal inclusion so that electromigration can be practiced.

Since the metallurgy of liquid inclusion migration is substantially the same whether the driving force is an electrical potential gradient or a thermal gradient, all configurations of P-N junctions in semiconductor crystals producible by the TGZM process are theoretically producible by the electromigration process of this invention. For a more thorough understanding of the TGZM techniques applicable to the practice of this invention including, for example, preparation of semiconductor and inclusion materials for liquid metal inclusion migration, and resultant product, one is directed to the above-referenced previously incorporated U.S. patents and, for example, the U.S. patents entitled Method of Making Deep Diodes, U.S. Pat. No. 3,901,736; Deep Diode Device and Method, U.S. Pat. No. 3,902,925; High Velocity Thermomigration Method of Making Deep Diodes, U.S. Pat. No. 3,898,106; The Stabilized Droplet Method of Making Deep Diodes Having Uniform Electrical Properties, U.S. Pat. No. 3,899,361; Thermomigration of Metal-Rich Liquid Wires Through Semiconductor Materials, U.S. Pat. No. 3,899,962; and Semiconductor Device Manufacture, U.S. Pat. No. 4,006,040 which are also herein incorporated by reference.

It will be understood, however, by those skilled in the semiconductor arts, that the discoveries of this invention provide benefits not necessarily available through the practice of the TGZM process as exemplified by the above-referenced and incorporated U.S. patents. For example, using the unique discoveries of this invention it is possible to produce diodes extending from a surface deep into the interior of the semiconductor body which have very sharp junctions between the recrystallized path and the host crystal in the direction of electromigration. This sharp junction is due to the ability to quickly reverse the direction of the applied electrical potential gradient. Further, since electromigration velocities are generally greater than thermomigration velocities at a given temperature, the electromigration process can be completed more rapidly, thus minimizing the time for diffusion of dopant atoms into the host semiconductor material, thereby producing sharp junctions perpendicular to the direction of migration as well.

During the making of this invention, three phenomena which could influence the electrical potential gradient driving force of the electromigration process were discovered. They are the formation of rectifying junctions, current funneling into the liquid metal inclusion and current funneling into the doped trail.

Figure 11:
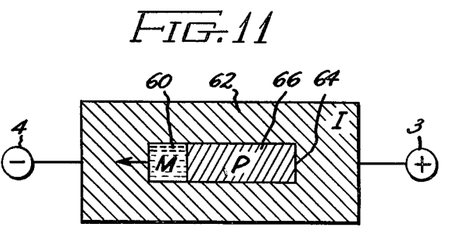
FIG. 11 is a schematic drawing in cross-section of a liquid metal inclusion electromigrating in a body of intrinsic semiconductor material, in response to an applied electrical potential gradient, forming a trail of recrystallized P-type semiconductor material.
Figure 12:
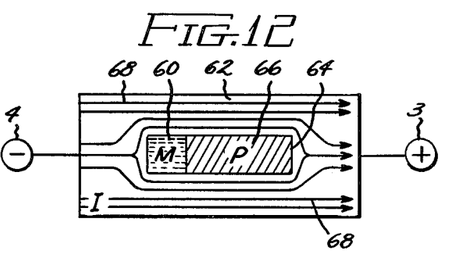
FIG. 12 is a schematic representation in cross-section of the phenomenon of current diversion caused by the formation of a rectifying junction.

The formation of rectifying junctions is dependent upon temperature and the type of conductivity, i.e., P-type, N-type, or intrinsic, exhibited by the host semiconductor and the recrystallized trail behind the electromigrating liquid metal inclusion. At sufficiently high temperatures, both the semiconductor parent crystal and the deposited semiconductor trail behind an electromigrating inclusion will have an intrinsic-type conductivity. As the temperature is lowered, a first transition temperature will be reached at which the trail will become extrinsic, i.e., P-type or N-type, while the host remains intrinsic. The trail changes to extrinsic before the host because either it has dopant atoms or a higher concentration of metal atoms compared to the host crystal. One typical situation is shown schematically in FIG. 11 wherein liquid metal inclusion 60 is electromigrating toward cathode 4 leaving a P-type recrystalized trail 66 while host semiconductor crystal 62 remains intrinsic. Junction 64 between trail 66 and host crystal 62 will be recognized by those familiar with the semiconductor arts as being reverse biased. Rectifying junction 64 can cause applied current 68 to be diverted around the inclusion, as shown schematically in FIG. 12, thus causing loss of the electrical potential driving force and, ultimately, cessation of electromigration.

Figure 13:
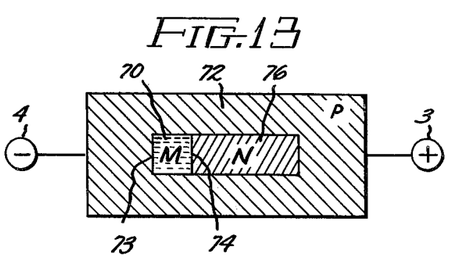
FIG. 13 is a schematic representation in cross-section of the formation of rectifying junctions of the Schottky type.

As the temperature decreases even further, the conductivity type of the host semiconductor will change from intrinsic to extrinsic at a second transition temperature. A typical situation is shown schematically in FIG. 13 wherein the rectifying junctions are in the form of metal-semiconductor i.e., Schottky type, junctions at the front 73 and rear 74 of inclusion 70 electromigrating in P-type host body 72 and forming N-type trail 76.

As disclosed in the above-cited co-assigned Serial No. 272,801 patent application, some eighteen distinct potential cases of reverse biased junctions involving the electromigration of P-type and N-type liquid metal droplets in intrinsic, P-type, and N-type semiconductor crystals have been identified. In six of those cases the rectifying junctions can be overcome and the electromigration doping ability and electromigration temperature range can be extended by making anode and cathode connections as disclosed and claimed therein.

If there is a large difference between the electrical conductivities of the host semiconductor crystal and the liquid metal inclusion, it might be assumed that the current density in the liquid metal inclusion might be different from the current density in the host crystal. Further, the consequence of this current density mismatch might be an increase of the electromigration velocity by a current concentration effect which would hinder accurate control of the process. It can be shown, and is in the above-cited and incorporated article in the Journal of Applied Physics, Vol. 51, No. 12 (Dec. 1980), pp. 6348–6355, that the actual current density in the liquid metal inclusion equals the current density applied to the host crystal and that no velocity enhancing effect of consequence occurs.

In addition to the large difference between the electrical conductivities of the host semiconductor crystal and the liquid metal inclusion, a large difference between electrical conductivity of the host semiconductor crystal and the metal-doped semiconductor trail behind an electromigrating inclusion exists at most temperatures. This difference in electrical conductivities between the host semiconductor and deposited trail causes the applied current to concentrate at the liquid metal inclusion. This effect is shown in FIG. 14 for a gallium-rich inclusion electromigrating in silicon.

Figure 14:
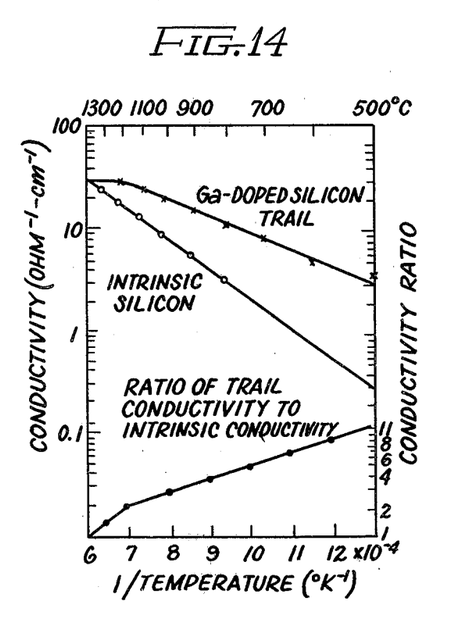
FIG. 14 is a semi-logarithmic graph of conductivity as a function of temperature for intrinsic silicon and a gallium doped trail deposited by an electromigrating gallium-rich liquid metal inclusion.

From FIG. 14, it can be seen that this effect becomes increasingly predominant as the electromigration temperature decreases. Since the effect is enhanced by the length of the deposited trail, current funneling into the doped trail becomes a factor for inclusions, such as finger diodes, migrating deeply into the host semiconductor crystal. However, as discovered during the course of making of this invention, compensation can be made experimentally for the host/trail conductivity mismatch. The ability to make such a compensation stems from the contemporaneous discovery that the penetration distance of a liquid metal inclusion into the host semiconductor from a surface is directly proportional to the number of coulombs/cm$^2$ passed through the host semiconductor. Thus a calibration curve of penetration distance vs. coulombs/cm$^2$ can be constructed for a series of electromigration temperatures. This calibration curve inherently includes the effects of current funneling into the doped trail.

In practice then, one can produce finger diodes with very exact penetration depths in a host semiconductor body once the calibration curve has been made. The penetration distance of the droplet can be controlled to about one-hundredth of a micron since the quantity of current used can be measured to about ±10 coulombs. Illustratively, if the calibration curve shows that $25 \times 10^4$ coulombs/cm$^2$ will electromigrate a gallium-rich liquid droplet 100 microns into a silicon body at 900° C., then a P-type finger diode can be made by first passing $25 \times 10^4$ coulombs/cm$^2$ through the body with the entrance surface at a positive potential relative to the opposed surface. Then the current direction would be reversed and slightly more than $25 \times 10^4$ coulombs passed through the body with the entrance surface at a negative potential relative to the opposing surface of the wafer to return the gallium-rich droplet to the entrance surface.

As a further extension of the novel discoveries herein of the electromigration of liquid metal inclusions in bulk host crystals, it has also been discovered that electromigration can be practiced in thin films.

Figure 15:
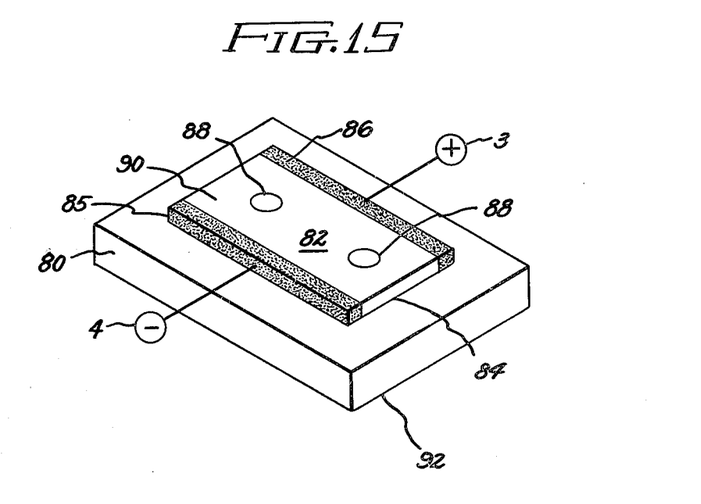
FIG. 15 is a schematic representation of thin film electromigration.

With reference to FIG. 15, there is shown schematically a composite body of a substrate 80 and a thin film 82 of substantially uniform thickness. Thin film 82 is of a deposited or otheriwse provided material situated on and conforming with at least a portion of substrate 80. The substrate, having top and bottom major opposed surfaces and an outer peripheral edge area interconnecting the major surfaces, may be a metal (e.g., copper) or a semiconductor (e.g., silicon, germanium, a III–V compound or a II–VI compound). In order to concentrate the electrical current in thin film 82, substrate 80 should not be electrically conductive. Alternatively, a thin insulating film, such as $SiO_2$, $Al_2O_3$, or diamond can be deposited at the interface 84 between the top surface of the substrate and the bottom surface of the thin film in order to restrict the current to the thin film. Suitable materials for thin film 82 include silicon, germanium, gallium phosphide, gallium arsenide, indium antimonide, cadmium telluride and zinc sulfide. If thin film 82 is silicon and substrate 80 is sapphire, thin film electromigration may be practiced with the silicon-on-sapphire material familiar to those practicing the semiconductor arts.

Cathode 4 and anode 3 are connected to thin film 82 by connections 85 and 86, respectively, which are located substantially opposite to each other on the thin peripheral edge area of thin film 82. Suitable methods for forming connections 85 and 86 are disclosed and claimed in the above-referenced Ser. No. 272,801 application. One or more solid metallic bodies 88 of the metal to be electromigrated are next deposited on exposed top surface 90 of thin film 82. Alternatively, as disclosed and claimed in the cited Ser. No. 272,801 application, the metal to be electromigrated may be deposited during the operation conducted to apply connections 85 and 86.

The temperature of thin film 82/substrate 80 composite is next raised to the electromigration temperature by any of the methods disclosed above. For thin films 82 having thickness less than or equal to about 1 mil (0.001 inches) bodies 88 will rapidly diffuse through the thickness of thin film 82. Once bodies 88 are liquified and present through the thickness of thin film 82, a DC electrical potential is applied between connections 85 and 86 and electromigration is commenced.

For thin films 82 thicker than about 1 mil, the droplet will have to be forced through the thickness of thin film 82 if through-thickness penetration is required in a reasonable period of time. Thus, in that circumstance at least, an opportunity to simultaneously practice Thermal Gradient Zone Melting and electromigration is presented. To do so, the thin film 82/substrate 80 composite with bodies 88 to be migrated would be placed in suitable equipment to establish and maintain a finite temperature gradient through thin film 82 and substrate 80 with the exposed, i.e., uppermost, surface 90 of thin film 82 being maintained at a colder temperature than the exposed, i.e., bottommost, surface 92 of substrate 90. The temperatures in the gradient through thin film 82 at least would be established and maintained above the melting temperatures of bodies 88 thus causing bodies 88 to melt and form liquid metal-rich inclusions 88 to be migrated. The thermal gradient will cause liquid metal inclusions 88 to migrate through the thickness of thin film 82 to interface 84 between thin film 82 and substrate 80. Electromigration would then be practiced to migrate inclusions 88 across thin film 82 between contacts 85 and 86 while TGZM would simultaneously maintain the presence of inclusions 88 through the thickness dimension of thin film 82. In this case then, the thermal gradient would be substantially perpendicular to the electrical gradient.

Figure 16:
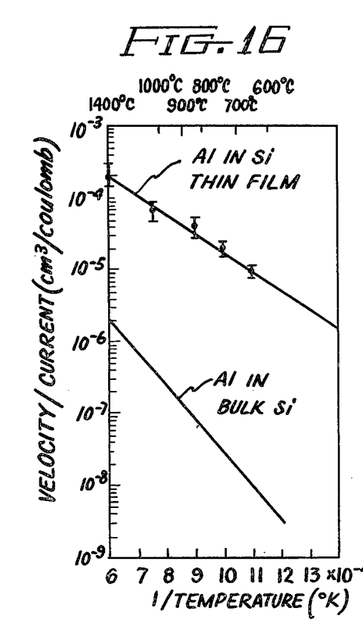
FIG. 16 is a semi-logarithmic graph of electromigration velocity divided by current density as a function of inverse temperature for aluminum electromigrating in thin films of silicon and in bulk silicon.

The speed of liquid zone electromigration in thin films was discovered to be greatly increased over the maximum rates in bulk solids as is evidenced by FIG. 16. To produce FIG. 16, aluminum inclusions were electromigrated across the thin (4 micron) silicon layer of commercially available silicon-on-sapphire (SOS) wafers at several temperatures and their velocities measured. Also plotted on FIG. 16, is the data for aluminum electromigration in bulk silicon from FIG. 4. It may be seen from FIG. 16 that thin film electromigration is about 2 to 3 orders of magnitude faster than bulk electromigration.

As a matter of explanation, but not limitation, thin film electromigration velocities are 100 to 1000 times faster than bulk electromigration rates primarily due to the fact that the intersection line of the free surface and the liquid zone provides a copious source of nucleation sites, such as atomic steps and ledges, which are not available to a liquid zone in the crystal bulk. Thus, nucleation barriers to zone migration are nonexistent when the liquid zone intersects a free surface, as is the case with thin film electromigration.

Second, the current density in a thin film can be orders of magnitude greater than the current density in a bulk crystal without causing melting. Very high current densities (i.e. on the order of $10^6$ amps/cm$^2$) can be carried in thin films because the Joule heating which would melt bulk materials is conducted away by the underlying substrate.

The combination of a higher intrinsic electromigration velocity (higher by a factor of about $10^2$ to $10^3$) and a higher possible current density (higher by a factor of about $10^3$ to $10^4$) results in potential thin film electromigration velocities of $10^5$ to $10^7$ greater than those in bulk materials, i.e., on the order of about 300 to 3000 cm/hr.

Processing costs for thin film electromigration are expected to be lower than the costs for bulk crystal processing by TGZM or electromigration for two reasons. First, although very high current densities are being used, the actual amount of current required is not large since the film along the current path is very thin. The second reason for the lower cost of thin film electromigration is the lower cost of the processing equipment since it need not have the capacity of equipment used for electromigration in bulk crystals.

Although this invention has been described particularly with reference to silicon semiconductor material, the novel technology of this invention of migrating liquid metal inclusions in host semiconductor materials with a reversible and controllable electric potential driving force is broadly applicable to other materials of the semiconductor arts, including, for example, germanium (Ge), gallium phosphide (GaP), gallium arsenide (GaAs), indium antimonide (InSb), cadmium telluride (CdTe) and zinc sulfide (ZnS).

Further, while the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A method for migrating one or more liquid metal inclusions in a host body of single crystal semiconductor material by means of an electrical potential gradient to produce one or more regions of recrystallized single crystal semiconductor material in said host body of semiconductor material, said regions having at least a resistivity different from that of said host body of semiconductor material, comprising the steps of:
  (a) determining the direction said one or more liquid metal inclusions are to be migrated along one or more paths in said host body between anode and cathode connections;
  (b) depositing one or more solid metallic bodies in contact with said host body, the material of each said solid metallic body being selected such that the material of each said solid metallic body:
    (i) is soluble in the semiconductor material of said host body, and
    (ii) forms a solution with the semiconductor material of said host body, said solution having a melting temperature lower than the melting temperature of the semiconductor material of said host body, and
    (iii) has a work function, $\phi_i$, such that the quantity $(\phi_i - \phi_h)$, where $\phi_h$ is the work function of the semiconductor material of said host body, has the same algebraic sign as the connection toward which said one or more inclusions are to be migrated;
  (c) applying said anode and cathode connections to said host body;
  (d) heating said host body to an elevated temperature, said elevated temperature being substantially constant and uniform throughout said host body and sufficient to melt said one or more solid metallic bodies forming thereby one or more liquid metal inclusions;

(e) applying said electrical potential gradient between said anode and cathode connections; and (f) migrating by means of said electrical potential gradient said one or more liquid metal inclusions in said host body along said path or paths forming thereby one or more regions of recrystallized single crystal semiconductor material integral with said host body, each said region of recrystallized single crystal semiconductor material comprising the material of the liquid metal inclusion which formed said region in solid solution up to the solid solubility limit of the material of said liquid metal inclusion in the semiconductor material of said host body and having at least a resistivity different from that of the semiconductor material of said host body.

2. The method of claim 1 wherein at least one of said regions of recrystallized single crystal semiconductor material also has a conductivity type different from the conductivity type of the semiconductor material of said host body.

3. The method of claim 1 wherein said deposit is situated within said body.

4. The method of claim 1 wherein said heating step is accomplished by applying heat from an external source.

5. The method of claim 1 wherein said heating step is accomplished by Joule heating.

6. The method of claim 1 wherein said heating step is accomplished by a combination of applying heat from an external source and Joule heating.

7. The method of claim 1 wherein the material of said one or more solid metallic bodies is one selected from the group consisting of gallium, silver, copper, aluminum, gold, tin, indium, palladium, and alloys thereof.

8. The method of claim 7 further including in said one or more solid metallic bodies a non-electromigratable dopant source selected from the group consisting of boron, phosphorus and arsenic.

9. The method of claim 1 wherein said semiconductor material of said host body is one selected from the group consisting of silicon, germanium, gallium arsenide, gallium phosphide, indium antimonide, cadmium telluride, and zinc sulfide.

10. A method for migrating one or more liquid metal inclusions in a host thin film of single crystal semiconductor material by means of an electrical potential gradient to produce one or more regions of recrystallized single crystal semiconductor material in said host thin film of semiconductor material, said regions having at least a resistivity different from that of said host thin film of semiconductor material, said thin film being situated on and conforming with at least a portion of a surface of an underlying substrate body, comprising the steps of:

(a) determining the direction said one or more liquid metal inclusions are to be migrated along one or more paths in said host thin film between anode and cathode connections;

(b) depositing one or more solid metallic bodies in contact with said host thin film, the material of each said solid metallic body being selected such that the material of each said solid metallic body;

(i) is soluble in the semiconductor material of said host thin film, and (ii) forms a solution with the semiconductor material of said host thin film, said solution having a melting temperature lower than the melting temperature of the semiconductor material of said host thin film, and (iii) has a work function, $\phi_i$, such that the quantity $(\phi_i - \phi_h)$, where $\phi_h$ is the work function of the semiconductor material of said host thin film, has the same algebraic sign as the connection toward which said one or more inclusions are to be migrated;

(c) applying said anode and cathode connections to said host thin film;

(d) heating said host thin film to an elevated temperature, said elevated temperature being substantially constant and uniform throughout said host thin film and sufficient to melt said one or more solid metallic bodies forming thereby one or more liquid metal inclusions;

(e) applying said electrical potential gradient between said anode and cathode connections; and (f) migrating by means of said electrical potential gradient said one or more liquid metal inclusions in said host thin film along said path or paths forming thereby one or more regions of recrystallized single crystal semiconductor material integral with said host thin film, each said region of recrystallized single crystal semiconductor material comprising the material of the liquid metal inclusion which formed said region in said solution up to the solid solubility limit of the material of said liquid metal inclusion in the semiconductor material of said host thin film and having at least a resistivity different from that of the semiconductor material of said host thin film.

11. The method of claim 10 wherein at least one of said regions of recrystallized single crystal semiconductor material also has a conductivity type different from the conductivity type of the semiconductor material of said host thin film.

12. The method of claim 10 wherein said heating step is accomplished by applying heat from an external source.

13. The method of claim 10 wherein said heating step is accomplished by Joule heating.

14. The method of claim 10 wherein said heating step is accomplished by a combination of applying heat from an external source and Joule heating.

15. The method of claim 10 wherein the material of said substrate body is one selected from the group consisting of copper, sapphire, germanium, gallium phosphide, gallium arsenide, indium antimonide, cadmium telluride, and zinc sulfide.

16. The method of claim 10 wherein the material of said host thin film is one selected from the group consisting of silicon, germanium, gallium phosphide, gallium arsenide, indium antimonide, cadmium telluride, and zinc sulfide.

17. The method of claim 10 wherein a thin insulating film is situate in the interface between said substrate body and said host thin film, said insulating film being one selected from the group consisting of silicon dioxide, alumina and diamond.

18. The method of claim 10 wherein the material of said one or more solid metallic bodies is one selected from the group consisting of gallium, silver, copper, aluminum, gold, tin, indium, palladium, and alloys thereof.

19. The method of claim 18 further including in said one or more solid metallic bodies a non-electromigratable dopant source selected from the group consisting of boron, phosphorus, and arsenic.

20. A method for migrating one or more liquid metal inclusions in a host thin film of single crystal semiconductor material by means of thermal and electrical potential gradients to produce one or more regions of recrystallized single crystal semiconductor material in said host thin film of semiconductor material, said regions having at least a resistivity different from that of said host thin film of semiconductor material, said thin film being situated on and conforming with at least a portion of a surface of an underlying substrate body, comprising the steps of:

(a) determining the direction said one or more liquid metal inclusions are to be migrated along one or more paths in said host thin film between anode and cathode connections;

(b) depositing one or more solid metallic bodies in contact with said host thin film, the material of each said solid metallic body being selected such that the material of each said solid metallic body:
  (i) is soluble in the semiconductor material of said host thin film, and
  (ii) forms a solution with the semiconductor material of said host thin film, said solution having a melting temperature lower than the melting temperature of the semiconductor material of said host thin film, and
  (iii) has a work function, $\phi_i$, such that the quantity $(\phi_i - \phi_h)$, where $\phi_h$ is the work function of the semiconductor material of said host thin film, has the same algebraic sign as the connection toward which said one or more inclusions are to be migrated;

(c) applying said anode and cathode connections to said host thin film;

(d) establishing and maintaining a finite temperature gradient through said host thin film and said substrate, the temperature of the uppermost surface of said thin film being lower than the temperature of the bottommost surface of said substrate, the temperatures in said gradient through said thin film being above the melting temperature of said one or more solid metallic bodies forming thereby one or more liquid metal inclusions extending through the thickness of said thin film;

(e) applying said electrical potential gradient between said anode and cathode connections, said electrical gradient being substantially perpendicular to the thickness of said thin film and being substantially perpendicular to said finite temperature gradient; and (f) migrating by means of said electrical potential gradient said one or more liquid metal inclusions in said host thin film along said path or paths forming thereby one or more regions of recrystallized single crystal semiconductor material integral with said host thin film, each said region of recrystallized single crystal semiconductor material comprising the material of the liquid metal inclusion which formed said region in solid solution up to the solid solubility limit of the material of said liquid metal inclusion in the semiconductor material of said host thin film and having at least a resistivity different from that of the semiconductor material of said host thin film.

21. The method of claim 20 wherein at least one of said regions of recrystallized single crystal semiconductor material also has a conductivity type different from the conductivity type of the semiconductor material of said host thin film.

22. The method of claim 20 wherein the material of said substrate body is one selected from the group consisting of copper, sapphire, germanium, gallium phosphide, gallium arsenide, indium antimonide, cadmium telluride, and zinc sulfide.

23. The method of claim 20 wherein the material of said host thin film is one selected from the group consisting of silicon, germanium, gallium phosphide, gallium arsenide, indium antimonide, cadmium telluride, and zinc sulfide.

24. The method of claim 20 wherein a thin insulating film is situate in the interface between said substrate body and said host thin film, said insulating film being one selected from the group consisting of silicon dioxide, alumina and diamond.

25. The method of claim 20 wherein the material of said one or more solid metallic bodies is one selected from the group consisting of gallium, silver, copper, aluminum, gold, tin, indium, palladium, and alloys thereof.

26. The method of claim 20 further including in said one or more solid metallic bodies a non-electromigratable dopant source selected from the group consisting of boron, phosphorus, and arsenic.

* * * * *